(12) United States Patent
Yamazawa

(10) Patent No.: US 7,993,487 B2
(45) Date of Patent: Aug. 9, 2011

(54) PLASMA PROCESSING APPARATUS AND METHOD OF MEASURING AMOUNT OF RADIO-FREQUENCY CURRENT IN PLASMA

(75) Inventor: Yohei Yamazawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1058 days.

(21) Appl. No.: 11/692,340

(22) Filed: Mar. 28, 2007

(65) Prior Publication Data

US 2007/0227667 A1 Oct. 4, 2007

Related U.S. Application Data

(60) Provisional application No. 60/792,319, filed on Apr. 17, 2006.

(30) Foreign Application Priority Data

Mar. 29, 2006 (JP) .................................. 2006-090278

(51) Int. Cl.
*H01L 21/00* (2006.01)
*C23C 16/00* (2006.01)
*C23C 14/00* (2006.01)

(52) U.S. Cl. ......... 156/345.28; 156/345.24; 156/345.25; 156/345.26; 118/712

(58) Field of Classification Search ............... 156/345.28
See application file for complete search history.

(56) References Cited

U.S. PATENT DOCUMENTS 6,878,233 B2 4/2005 Hirose
2006/0249729 A1* 11/2006 Mundt et al. .................... 257/48

FOREIGN PATENT DOCUMENTS

JP 2002-43402 2/2002

* cited by examiner

*Primary Examiner* — Ram N Kackar
(74) *Attorney, Agent, or Firm* — Oblon, Spivak, McClelland, Maier & Neustadt, L.L.P.

(57) ABSTRACT

In the present invention, two coil-shaped probes each detecting the intensity of a magnetic field in a direction around a center axis of a processing space are provided in a process vessel of a plasma processing apparatus. Each of the probes detects an induced electromotive force generated in the coil, and a computer calculates an amount of radio-frequency current from the induced electromotive force, based on a predetermined calculation principle. A difference between the amounts of the radio-frequency current detected by the probes is calculated, and a loss radio-frequency current amount passing out of a plasma area between upper and lower electrodes is calculated, whereby the flow of the radio-frequency current in the plasma is known.

14 Claims, 7 Drawing Sheets

PLASMA PROCESSING APPARATUS AND METHOD OF MEASURING AMOUNT OF RADIO-FREQUENCY CURRENT IN PLASMA

CROSS REFERENCE TO RELATED APPLICATIONS

The present invention contains subject matter related to Japanese Patent Application No. 2006-90278, filed on Mar. 29, 2006 and Provisional Application No. 60/792,319, filed on Apr. 17, 2006, the entire contents of which being incorporated herein by reference.

BACKGROUND OF THE INVENTION

1. Field of the Invention

The present invention relates to a plasma processing apparatus which processes a substrate by generating plasma in a process vessel, and a method of measuring an amount of radio-frequency current in the plasma in the plasma processing apparatus.

2. Description of the Related Art

Processing using plasma is widely used in substrate processing such as etching and deposition in manufacturing processes of, for example, semiconductor devices, liquid crystal display devices, and the like.

The plasma processing is usually performed in a plasma processing apparatus. This plasma processing apparatus includes upper and lower electrodes facing each other in a process vessel, and radio-frequency power is supplied to the lower electrode on which, for example, a substrate is placed, to generate plasma between the lower electrode and the upper electrode, thereby processing the substrate.

In the above-described plasma processing, radio-frequency current flows in the plasma from the lower electrode to the upper electrode when the radio-frequency power is supplied. This radio-frequency current contributes to the generation of the plasma, and the state of the plasma such as plasma density, a self-bias (Vdc), and the like is closely correlated with the radio-frequency current. Therefore, the radio-frequency current is an important factor in evaluating the processing state of the substrate. Therefore, in conventional plasma processing apparatuses, a current sensor is attached to an output side of a matching device connected to the lower electrode to measure an amount of the radio-frequency current flowing from the matching device to the electrode (see Japanese Patent Application Laid-open No. 2002-43402 and U.S. Pat. No. 6,879,233).

SUMMARY OF THE INVENTION

However, in a case where the current sensor is provided on the output side of the matching device as described above, a measurement point of the amount of the radio-frequency current is distant from the plasma and power is consumed due to the influence of impedance of the process vessel, and consequently, a current amount measured by the current sensor is different from an amount of the radio-frequency current actually passing through the plasma. This has made it difficult to correctly evaluate the processing state of the substrate from the measured amount of the radio-frequency current. In particular, in a case of a radio-frequency wave of about several tens MHz used for an etching process, an amount of the current at the measurement point on the output side of the aforesaid matching device becomes often greatly different from an amount of the current actually entering the plasma, and in this case, it has not been possible to correctly know the processing state of the substrate.

Incidentally, a change in the condition in the process vessel, for example, contamination, damage, and the like of an inner wall surface of the process vessel and the upper and lower electrodes can be detected from a change in the flow of the radio-frequency current in the plasma. However, since the aforesaid current sensor cannot detect the flow of the radio-frequency current in the plasma, it has not been possible to detect a change in the condition in the process vessel. Therefore, it has not been possible to quickly detect the fluctuation in the processing state of the substrate caused by the change in the condition in the process vessel and cope with the fluctuation.

Further, even in plasma processing apparatuses with the same specifications, the condition in the process vessel slightly differs depending on each of the plasma processing apparatuses, but since the flow of the radio-frequency current in the plasma which is an indication of this condition cannot be detected as described above, it has not been possible to correct the difference in the condition among the plasma processing apparatuses (machine difference). As a result, if substrates are processed in a plurality of plasma processing apparatuses in parallel, there have sometimes occurred variation in the processing state of the substrates among the apparatuses.

The present invention was made in view of the above respect, and an object thereof is to correctly detect an amount of radio-frequency current flowing in plasma in a process vessel, and to know the flow of the radio-frequency current in the plasma.

To attain the above object, the present invention is a plasma processing apparatus which has upper and lower radio-frequency electrodes facing each other in a process vessel and processes a substrate by supplying radio-frequency power to at least one of the radio-frequency electrodes and generating plasma in the process vessel, the apparatus including: a probe which is disposed in the process vessel to detect a time varying magnetic flux density directed in a azimuthal direction around an up/down-direction center axis of the process vessel; and a calculation part which calculates an amount of radio-frequency current passing in an axial direction in the plasma when the radio-frequency power is supplied, based on the time varying magnetic flux density detected by the probe, wherein the probes are provided at a plurality of positions in the up/down direction in the process vessel.

According to the present invention, the time varying magnetic flux density actually generated in the direction around the center axis of the process vessel is detected, and the amount of the radio-frequency current can be calculated from the time varying magnetic flux density. This enables correct detection of the amount of the radio-frequency current passing in the axial direction in the plasma in the process vessel. As a result, it is possible to correctly evaluate the processing state of a substrate. Further, since the amounts of the radio-frequency current at the plural positions can be calculated by the probes disposed at the plural positions in the up/down direction in the process vessel, it is possible to detect variation in the amount of the radio-frequency current in the process vessel to know the flow of the radio-frequency current. As a result, a change in the condition in the process vessel can be detected. Moreover, the conditions of a plurality of apparatuses can be made the same.

Each of the probes may be formed in a coil shape, and an axis of the coil may be directed in the azimuthal direction around the center axis of the process vessel. Further, each of the probes may detect an induced electromotive force generated in the coil, as the time varying magnetic flux density, and the calculation part may calculate the amount of the radio-frequency current from the induced electromotive force.

Further, the probes of the above-described plasma processing apparatus may be provided at heights between the upper and lower radio-frequency electrodes.

The probes may be provided on an outer side of the substrate held on one of the upper and lower radio-frequency electrodes in the process vessel.

At least one of the probes of the above-described plasma processing apparatus may be provided at a height immediately under the upper radio-frequency electrode, and at least another of the probes may be provided at a height immediately above the lower radio-frequency electrode.

The calculation part of the above-described plasma processing apparatus may be structured to subtract an amount of the radio-frequency current detected by the probe close to one of the radio-frequency electrodes from an amount of the radio-frequency current detected by the probe close to the other radio-frequency electrode and calculate an amount of the radio-frequency current passing in a radial direction, based on an amount by which the radio-frequency current in the axial direction increases/decreases between the probes.

The above-described plasma processing apparatus may further include a control part which executes the calculation of the amount of the radio-frequency current between the probes during the processing of the substrate, and stops the processing of the substrate based on the calculated amount of the radio-frequency current and a preset threshold value of the amount of the radio-frequency current.

The above-described plasma processing apparatus may further include an analysis part which decomposes the detected time varying magnetic flux density into frequency components included in the detected time varying magnetic flux density, and the calculation part may calculate the amount of the radio-frequency current between the probes for each of the frequencies.

The above-described plasma processing apparatus may further include an adjustment part which adjusts an amount of the radio-frequency current with a specific frequency based on the amount of the radio-frequency current calculated for each of the frequencies.

Each of the probes of the above-described plasma processing apparatus may be covered by an insulative cover.

The probes of the above-described plasma processing apparatus may be buried in a member facing the generated plasma, and the probes may be buried in, for example, a wall portion of the process vessel.

Further, the lowest probe may be buried in an annular member surrounding an outer periphery of the substrate held on the lower radio-frequency electrode in the process vessel.

The probes of the above-described plasma processing apparatus may be movable up and down in the process vessel.

The present invention according to another aspect is a method of measuring an amount of radio-frequency current passing in plasma in a plasma processing apparatus which has upper and lower radio-frequency electrodes facing each other in a process vessel and processes a substrate by supplying radio-frequency power to at least one of the radio-frequency electrodes and generating the plasma in the process vessel, the method including the steps of: detecting a time varying magnetic flux density directed in a azimuthal direction around an up/down-direction center axis of the process vessel, by probes disposed at a plurality of positions in the up/down direction in the process vessel; calculating an amount of the radio-frequency current passing in an axial direction in the plasma when the radio-frequency power is supplied, based on the time varying magnetic flux density detected by each of the probes; and subtracting an amount of the radio-frequency current detected by the probe close to one of the radio-frequency electrodes from an amount of the radio-frequency current detected by the probe close to the other radio-frequency electrode and calculating an amount of the radio-frequency current passing in a radial direction, based on an amount by which the radio-frequency current in the axial direction increases/decreases between the probes.

According to the present invention, since an amount of radio-frequency current passing in generated plasma can be accurately detected, it is possible to correctly know the processing state of a substrate from the detected amount of the radio-frequency current. Moreover, it is possible to know the flow of the radio-frequency current in the plasma, and as a result, based on the flow, it is possible to detect a change in condition of the apparatus, and to correct a machine difference among the apparatuses.

DETAILED DESCRIPTION OF THE PREFERRED EMBODIMENT

Figure 1:
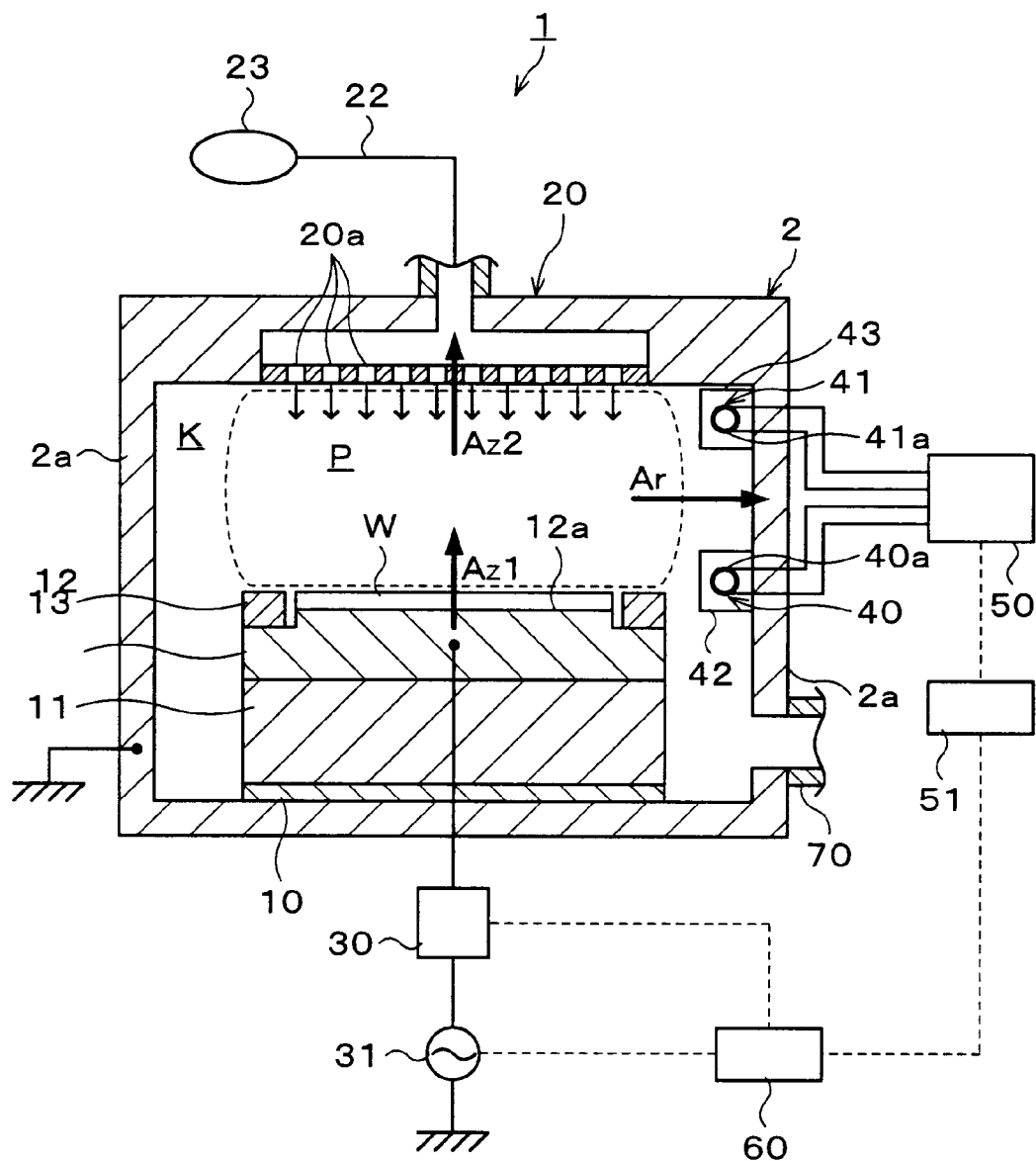
FIG. 1 is an explanatory vertical cross-sectional view roughly showing the structure of a plasma etching apparatus according to this embodiment.

Hereinafter, a preferred embodiment of the present invention will be described. FIG. 1 is an explanatory vertical cross-sectional view roughly showing the structure of a plasma etching apparatus 1 as a plasma processing apparatus according to the present invention. In the present specification and the drawings, constituent elements having substantially the same functional structure are denoted by the same reference numerals and symbols, and thus repeated description thereof will be omitted.

As shown in FIG. 1, the plasma etching apparatus 1 includes a process vessel 2 in, for example, a substantially cylindrical shape. A processing space K is formed in the process vessel 2. An inner wall surface of the process vessel 2 is covered by a protective film of, for example, alumina or the like. The process vessel 2 is grounded.

For example, on a bottom portion of a center portion of the process vessel 2, a columnar electrode support table 11 is provided via an insulation plate 10. On the electrode support table 11, provided is a lower electrode 12 as a radio-frequency electrode serving also as a mounting table for placing a substrate W thereon. For example, a center portion of an upper surface of the lower electrode 12 protrudes in a columnar shape, and the substrate W is held on this protruding portion 12a. The protruding portion 12a is an electrostatic chuck. Around the protruding portion 12a of the lower electrode 12, a focus ring 13 as an annular member which is made of quartz and formed in a ring shape is provided.

On a ceiling portion, of the process vessel 2, facing the lower electrode 12, an upper electrode 20 in, for example, a substantially disk shape is attached. In a lower surface of the upper electrode 20, for example, a large number of gas jetting ports 20a are formed. The gas jetting ports 20a communicate with a gas supply source 23 via a gas supply pipe 22 connected to an upper surface of the upper electrode 20. In the gas supply source 23, process gas for an etching process is stored, and the process gas led through the gas supply pipe 22 into the upper electrode 20 is supplied to the processing space K through the plural gas jetting ports 20a.

A radio-frequency power source 31 is electrically connected to the lower electrode 12 via a matching unit (not shown). The radio-frequency power source 31 is capable of outputting radio-frequency power with, for example, 40 MHz frequency or higher, for example, with a 60 MHz frequency. In addition to the matching unit, an impedance adjustment part 30 capable of correcting impedance of a circuit of the lower electrode 12 side is provided between the radio-frequency power source 31 and the lower electrode 12. Incidentally, the operations of the radio-frequency power source 31 and the impedance adjustment part 30 are controlled by a later-described control part 60.

Figure 2:
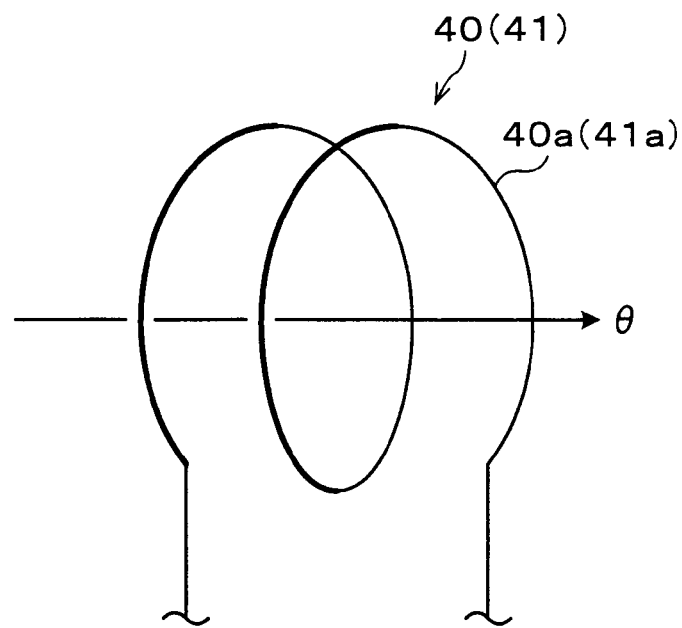
FIG. 2 is a schematic view of coils of probes.
Figure 3:
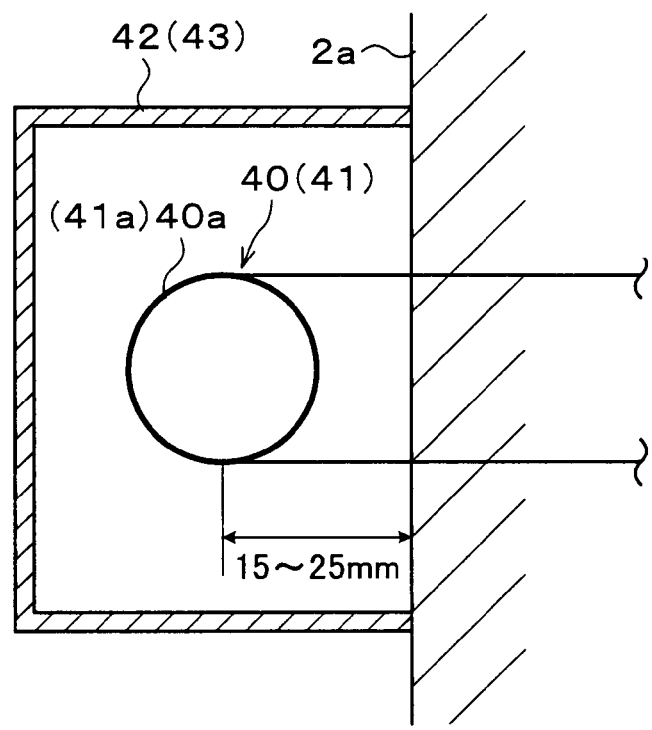
FIG. 3 is an explanatory view showing an installation position of the probes.

Near a sidewall portion 2a of the process vessel 2, two probes 40, 41 are arranged in an up/down direction. For example, the lower probe 40 is constituted of a double-wound circular coil 40a with an about 3 mm diameter, as shown in, for example, in FIG. 2. An axis of the coil 40a is directed in a azimuthal direction θ around an up/down-direction center axis of the process vessel 2. In other words, the coil 40a is disposed, with a coil face making a right angle relative to both of a surface of the substrate W on the lower electrode 12 and an inner surface of the sidewall portion 2a of the process vessel 2, as shown in FIG. 1. With this structure, a magnetic flux in the azimuthal direction θ generated in the processing space K penetrates the inside of the coil 40a, and by a change in the magnetic flux, an induced electromotive force can be generated in the coil 40a. Therefore, the lower probe 40 can detect the induced electromotive force as a time varying magnetic flux density in the azimuthal direction θ.

The upper probe 41, which also has the same structure as that of the lower probe 40, is constituted of, for example, a double-wound circular coil 41a, and an axis of the coil 41a is directed in the azimuthal direction θ around the up/down-direction center axis of the process vessel 2. Therefore, the magnetic flux in the azimuthal direction θ generated in the processing space K penetrates the coil 41a of the upper probe 41, and the upper probe 41 can detect an induced electromotive force induced in the coil 41a by a change in the magnetic flux, as a time varying magnetic flux density in the azimuthal direction θ.

The lower probe 40 is disposed, for example, immediately above the lower electrode 12, specifically, at a position which is an outer side of the substrate provided on the lower electrode 12 and is substantially the same height as the substrate W. For example, the lower probe 40 is positioned so that a lower end portion of the coil 40a becomes 5 mm to 10 mm higher than the surface of the substrate W. With this structure, the lower probe 40 can detect the time varying magnetic flux density in the azimuthal direction θ at a height near the lower electrode 12. Further, the position of the lower probe 40 is near the sidewall portion 2a and apart from the inner surface of the sidewall portion 2a by 15 mm to 25 mm, more preferably, 20 mm. The lower probe 40 is covered by an insulative cover 42 of, for example, quartz or ceramics fixed on the sidewall portion 2a.

The upper probe 41 is disposed at a height, for example, immediately under the upper electrode 20 as shown in FIG. 1. For example, the upper probe 41 is positioned so that an upper end portion of the coil 41a becomes about 5 mm to about 10 mm lower than the lower surface of the upper electrode 20. Further, similarly to the lower probe 40, the upper probe 41 is disposed at a position which is near the sidewall portion 2a and apart from the inner surface of the sidewall portion 2a by 15 mm to 25 mm, more preferably, 20 mm. The upper probe 41 is covered by an insulative cover 43 of, for example, quartz or ceramics fixed on the sidewall portion 2a.

The coil 40a of the lower probe 40 and the coil 41a of the upper probe 41 are connected to an analyzer box 50 as an analysis part. The analyzer box 50 is capable of decomposing the time varying magnetic flux density (induced electromotive force) detected by each of the probes 40, 41 into frequency components included therein.

The analyzer box 50 is connected to a computer 51 as a calculation part. The computer 51 calculates an amount of radio-frequency current passing in the plasma in the processing space K, from the induced electromotive force of each of the frequency components resulting from the decomposition by the analyzer box 50, based on a later-described calculation principle, and is capable of storing information of the calculated amounts. The amount of the radio-frequency current mentioned here is a total current amount of the radio-frequency current flowing in a plasma area P at the position of each of the probes 40, 41.

Figure 4:
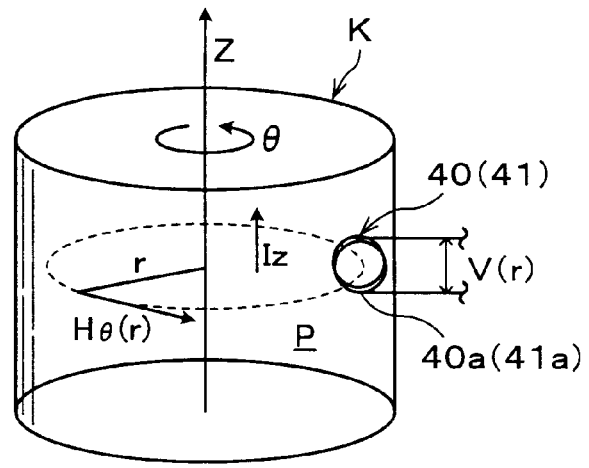
FIG. 4 is a schematic view of a processing space where an amount of radio-frequency current is calculated.

Here, the calculation principle of a radio-frequency current amount Az of a radio-frequency current Iz flowing in the axial direction in the plasma area P will be described by using FIG. 4. FIG. 4 schematically shows the inside of the process vessel 2 having the plasma area P. In FIG. 4, r is the distance from the center axis of the process vessel 2, $H_\theta(r)$ is the intensity of the magnetic field in the azimuthal direction θ, and V(r) is the induced electromotive force generated in the coil 40a (41a). The radio-frequency current Iz is expressed by the following expression (1) by using the radio-frequency current amount Az (ω is a frequency of a radio-frequency wave).

$$I_z = A_z \cos(\omega t) \quad (1)$$

According to the Ampere's rule, the following expression (2) holds.

$$\oint H_\theta(r) ds = I_z \quad (2)$$

$$H_\theta(r) = \frac{1}{2\pi r} I_z$$

Further, according to the Faraday's law, the following expression (3) holds, $$V(r) = -\frac{d\Phi}{dt} \quad (3)$$

where φ is the magnetic flux. If the expressions (1), (2) are substituted in the expression (3) for transformation, then, $$V(r) = -\frac{d\Phi}{dt}$$
$$= -N\mu_0 S \frac{d}{dt} H_\theta(r)$$
$$= N\mu_0 S \frac{\omega}{2\pi r} A_z$$

where N is a number of windings of the coil 40*a* (41*a*), S is an area of the coil face, and $\mu_0$ is magnetic permeability. Therefore, $$A_z = \frac{2\pi r}{N\mu_0 S\omega} V(r) \quad (4)$$

and thus, the radio-frequency current amount Az is calculated from the induced electromotive force V(r) generated in the coil 40*a*.

Hereinafter, the induced electromotive force generated in the coil 40*a* of the lower probe 40 is defined as V(r)1 and the radio-frequency current amount calculated from the induced electromotive force V(r)1 is defined as Az1. Further, the induced electromotive force generated in the coil 41*a* of the upper probe 41 is defined as V(r)2 and the radio-frequency current amount calculated from the induced electromotive force V(r)2 is defined as Az2. In a case of this example, the radio-frequency current amount Az1 calculated by the lower probe 40 is an amount of the radio-frequency current inputted to the plasma area P from the lower electrode 12, and the radio-frequency current amount Az2 calculated by the upper probe 41 is an amount of the radio-frequency current outputted to the upper electrode 20 from the plasma area P.

The computer 51 further calculates a difference between the radio-frequency current amount Az1 and the radio-frequency current amount Az2, whereby it can calculate a loss radio-frequency current amount Ar (Ar=Az1−Az2) flowing out in a radial direction, that is, to the sidewall portion 2*a* between the upper electrode 20 and the lower electrode 12. The computer 51 is capable of outputting information of the calculated loss radio-frequency current amount Ar to, for example, the control part 60 of the plasma etching apparatus 1.

The control part 60 compares, for example, the outputted loss radio-frequency current amount Ar and a preset threshold value, and when a value of the loss radio-frequency current amount Ar exceeds the threshold value, the control part 60 can stop the processing of the substrate W by outputting an error. Incidentally, as for the threshold value, for example, a value of the loss radio-frequency current amount Ar when a problem occurs in the condition of the process vessel 2 and the processing state of the substrate W is found in advance, and the value is set as the threshold value.

As shown in FIG. 1, an exhaust pipe 70 communicating with an exhaust mechanism (not shown) is connected to a lower portion of the process vessel 2. By vacuuming the inside of the process vessel 2 via the exhaust pipe 70, it is possible to reduce the pressure of the processing space K to a predetermined pressure.

Next, the operation of the plasma etching apparatus 1 as structured above will be described.

When the etching process is performed in the plasma etching apparatus 1, the substrate W is first carried into the process vessel 2 to be placed on the lower electrode 12 as shown in FIG. 1. By the exhaust through the exhaust pipe 70, the pressure in the process vessel 2 is reduced, and predetermined process gas is supplied through the gas jetting ports 20*a*. Next, the radio-frequency power source 31 supplies the radio-frequency power for plasma generation to the lower electrode 12. Consequently, radio-frequency voltage is applied between the lower electrode 12 and the upper electrode 20, the plasma is generated in the processing space K between the lower electrode 12 and the upper electrode 20 in the process vessel 2, and the plasma area P is formed. By this plasma, active species, ions, and so on are generated from the process gas and a surface film of the substrate W is etched. After the etching for a predetermined time, the supply of the radio-frequency power and the supply of the process gas are stopped, and the substrate W is carried out of the process vessel 2, whereby a series of the etching processes is finished.

In the plasma etching apparatus 1, to detect variation in the radio-frequency current amount in, for example, the plasma area P, a time varying magnetic flux density in the azimuthal direction θ near the lower electrode 12 in the processing space K is first detected by the lower probe 40 during the generation of the plasma. At this time, the magnetic flux φ in the azimuthal direction θ near the lower electrode 12 in the processing space K passes in the coil 40*a* of the lower probe 40, and the induced electromotive force V(r)1 is generated in the coil 40*a* due to the change in the magnetic flux φ in the coil 40*a*. This induced electromotive force V(r)1 is detected as the time varying magnetic flux density near the lower electrode 12. Further, a time varying magnetic flux density in the azimuthal direction θ near the upper electrode 20 in the processing space K is detected by the upper probe 41. The magnetic flux φ in the azimuthal direction θ near the upper electrode 20 in the processing space K passes in the coil 41*a* of the lower probe 41, and the induced electromotive force V(r)2 is generated in the coil 41*a* due to the change in the magnetic flux φ in the coil 41*a*. This induced electromotive force V(r)2 is detected as the time varying magnetic flux density near the upper electrode 20.

Detection information of the induced electromotive forces V(r)1, V(r)2 are inputted to the analyzer box 50, and the analyzer box 50 decomposes each of the detected induced electromotive forces V(r)1, V(r)2 into frequency components such as a fundamental, harmonics, and the like of the radio-frequency power. The induced electromotive forces V(r)1, V(r)2 decomposed into the frequency components are sent to the computer 51, and the computer 51 calculates the radio-frequency current amounts Az1, Az2 corresponding to the respective induced electromotive forces V(r)1, V(r)2 by using the calculation principle such as the aforesaid expression (4) and so on. Further, the computer 51 calculates the loss radio-frequency current amount Ar by subtracting the radio-frequency current amount Az2 from the radio-frequency current amount Az1.

The calculated radio-frequency current amounts Az1, Az2 and the loss radio-frequency current amount Ar are outputted to, for example, the control part 60, where the loss radio-frequency current amount Ar for each of the frequency components is compared with, for example, the preset threshold value. The loss radio-frequency current amount Ar, if equal to or smaller than the threshold value, is judged as normal. If the loss radio-frequency current amount Ar exceeds the threshold value, for example, an error is outputted to stop the processing of the substrate W. Further, the information of the radio-frequency current amounts Az1, Az2 and the loss radio-frequency current amount Ar is stored in the control part 60 to be used as information for evaluating the processing state of the substrate W and the condition in the process vessel 2. Incidentally, depending on the way how the threshold value is set, the error may be outputted when the loss radio-frequency current amount Ar becomes less than the threshold value.

According to the above-described embodiment, since the probes 40, 41 are disposed in the process vessel 2, it is possible to directly detect the radio-frequency current amount Az flowing in the plasma. This enables correct detection of the radio-frequency current amount Az, and based on this radio-frequency current amount Az, it is possible to correctly evaluate, for example, the processing state of the substrate W.

Further, since the probes 40, 41 are provided near the upper and lower electrodes 12, 20 respectively in the process vessel 2, it is possible to detect the radio-frequency current amount Az1 inputted into the plasma area P from the lower electrode 12 and the radio-frequency current amount Az2 outputted from the plasma area P to the upper electrode 20, and from these radio-frequency current amounts Az1, Az2, it is possible to detect the loss radio-frequency current amount Ar flowing to the sidewall surface 2a between the lower electrode 12 and the upper electrode 20. Consequently, it is possible to detect variation in the radio-frequency current amount in the plasma area P to know the flow of the radio-frequency current in the plasma area P. As a result, for example, the condition in the process vessel 2 is known. For example, when the inner wall surface of the process vessel 2 and the electrodes 12, 20 suffer contamination or crack, or when the protective film on the inner wall surface is reduced, or when abnormal discharge is occurring in the gas jetting ports 20 of the upper electrode 20, the flow of the radio-frequency current Iz toward the upper electrode 20 or toward the sidewall surface 2a is disturbed, so that the radio-frequency current amount Az and the loss radio-frequency current amount Ar change. Therefore, by knowing the flow of the radio-frequency current from the radio-frequency current amount Az and the loss radio-frequency current amount Ar as in this embodiment, it is possible to detect a change in the condition in the process vessel 2. Further, since the condition in the process vessel 2 is known, it is possible to correct a machine difference from another plasma etching apparatus based on the condition.

Further, the probes 40, 41 are formed in a coil shape and the axis of each of the coils 40a, 41a is directed in the azimuthal direction θ of the processing space K, and therefore, by making the magnetic flux φ penetrate the inside of the coils 40a, 41a to generate the induced electromotive force in the coils 40a, 41a by electromagnetic induction, it is possible to easily and correctly detect the time varying magnetic flux density in the azimuthal direction θ based on the induced electromotive force V(r).

Since the probes 40, 41 are covered by the insulative covers 42, 43 made of quartz or ceramics, it is possible to prevent the corrosion of the probes 40, 41 caused by the plasma.

Since the probes 40, 41 are disposed at positions which are the outer side of the substrate W in the process vessel 2 and near the sidewall portion 2a, the probes 40, 41, even if provided in the process vessel 2, do not interfere with the processing of the substrate W in the processing space K, which enables the proper processing of the substrate W.

Figure 5:
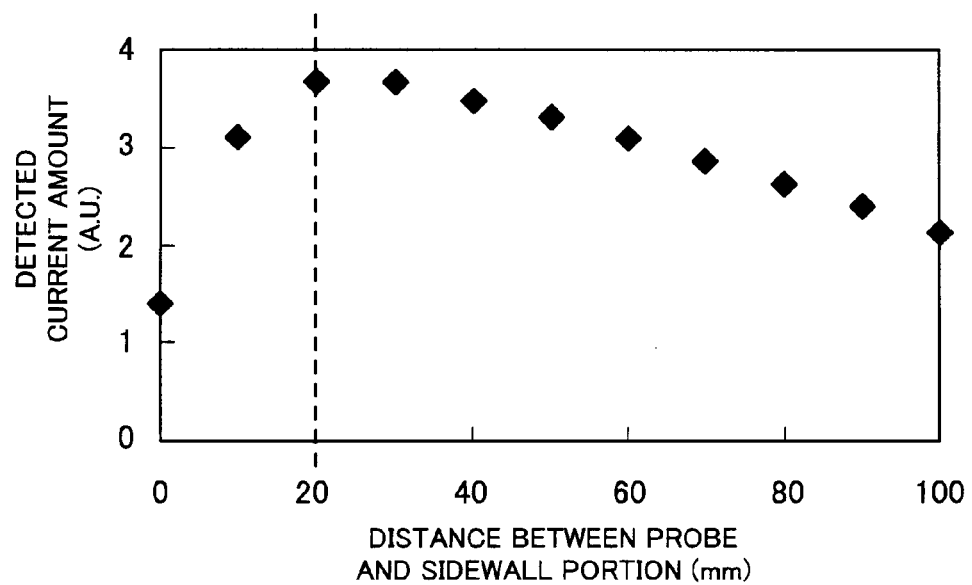
FIG. 5 is a graph showing the correlation between the distance from a probe to a sidewall portion and a detected amount of current at this position.

Further, the probes 40, 41 are provided at the positions apart from the inner surface of the sidewall portion 2a of the process vessel 2 by 15 mm to 25 mm. FIG. 5 is a graph showing a current amount detected by a probe, with the distance between the probe and the sidewall portion 2a being varied and with other conditions being the same. From the graph in FIG. 5, it is apparent that the detected current amount is high when the probe is 15 mm to 25 mm distant from the sidewall portion 2a. Therefore, by positioning the probes 40, 41 within an area 15 mm to 25 mm distant from the sidewall portion 2a, it is possible to make sensitivity of the probes 40, 41 optimum.

Further, in the above-described embodiment, since the lower probe 40 is disposed at the height immediately above the lower electrode 12, that is, at substantially the same height as the substrate W, the radio-frequency current amount Az1 flowing into the plasma area P from the lower electrode 12 can be correctly detected. Further, since the upper probe 41 is disposed at the height immediately under the upper electrode 20, it is possible to correctly detect the radio-frequency current amount Az2 flowing into the upper electrode 20 from the plasma area P. Accordingly, the loss radio-frequency current amount Ar flowing to the outside before the radio-frequency current reaches the upper electrode 20 from the lower electrode 12 can be also correctly detected.

In the above-described embodiment, since the control part 60 stops the processing of the substrate W when the loss radio-frequency current amount Ar exceeds the threshold value, it is possible to quickly cope with an abnormal processing state of the substrate W and an abnormal condition in the process vessel 2, which makes it possible to prevent the manufacture of a large quantity of defective substrates W.

Since the analyzer box 50 decomposes the induced electromotive forces V(r)1, V(r)2 outputted from the probes 40, 41 into the frequency components such as the fundamental, harmonics, and so on of the radio-frequency power, it is possible for the computer 51 to calculate the radio-frequency current amounts Az1, Az2 and the loss radio-frequency current amount Ar for each of the frequency components. This makes it possible to know the processing state of the substrate W and the condition in the process vessel 2 in more detail.

Figure 6:
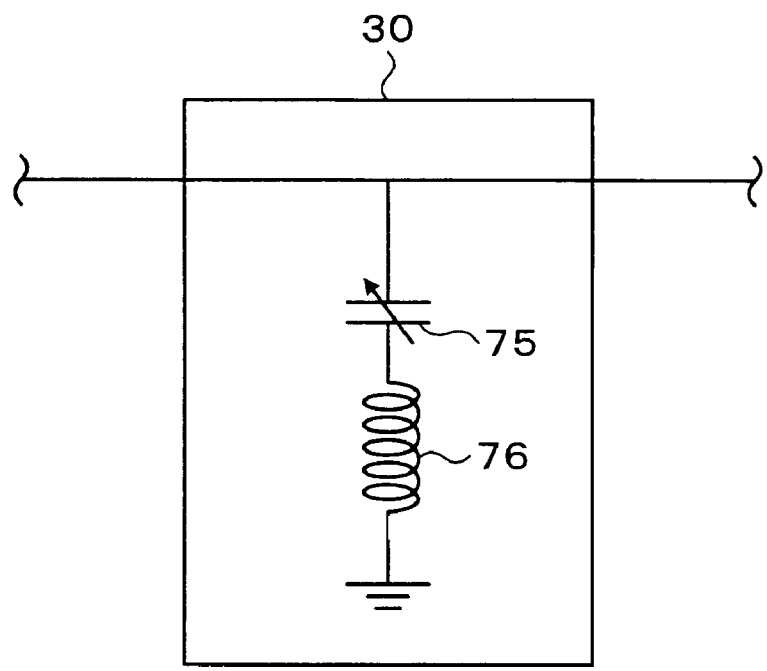
FIG. 6 is a schematic view showing the structure of an impedance adjustment part.

In the above-described embodiment, the impedance to the fundamental and harmonics in a circuit of the lower electrode 12 side may be controlled based on the calculated radio-frequency current amounts Ar of the fundamental and harmonics which are specific frequency components. In this case, for example, the impedance adjustment part 30 is composed of a variable capacitor 75 as a variable element, a fixed coil 76, and so on as shown in FIG. 6, and by changing the capacity of the variable capacitor 75, it is possible to change the impedance to the fundamental and harmonics of the whole circuit of the lower electrode 12 side. The control part 60 controls the impedance adjustment part 30 based on the calculated radio-frequency current amount Az and loss radio-frequency current amount Ar of the fundamental and harmonics, thereby controlling the impedance to the fundamental and harmonics of the circuit of the lower electrode 12 side. Consequently, it is possible to adjust the radio-frequency current amount Az and the loss radio-frequency current amount Ar of the fundamental and harmonics in the plasma, so that the state of the plasma, the processing state of the substrate W, or the condition in the process vessel 2 can be more properly adjusted.

Figure 7:
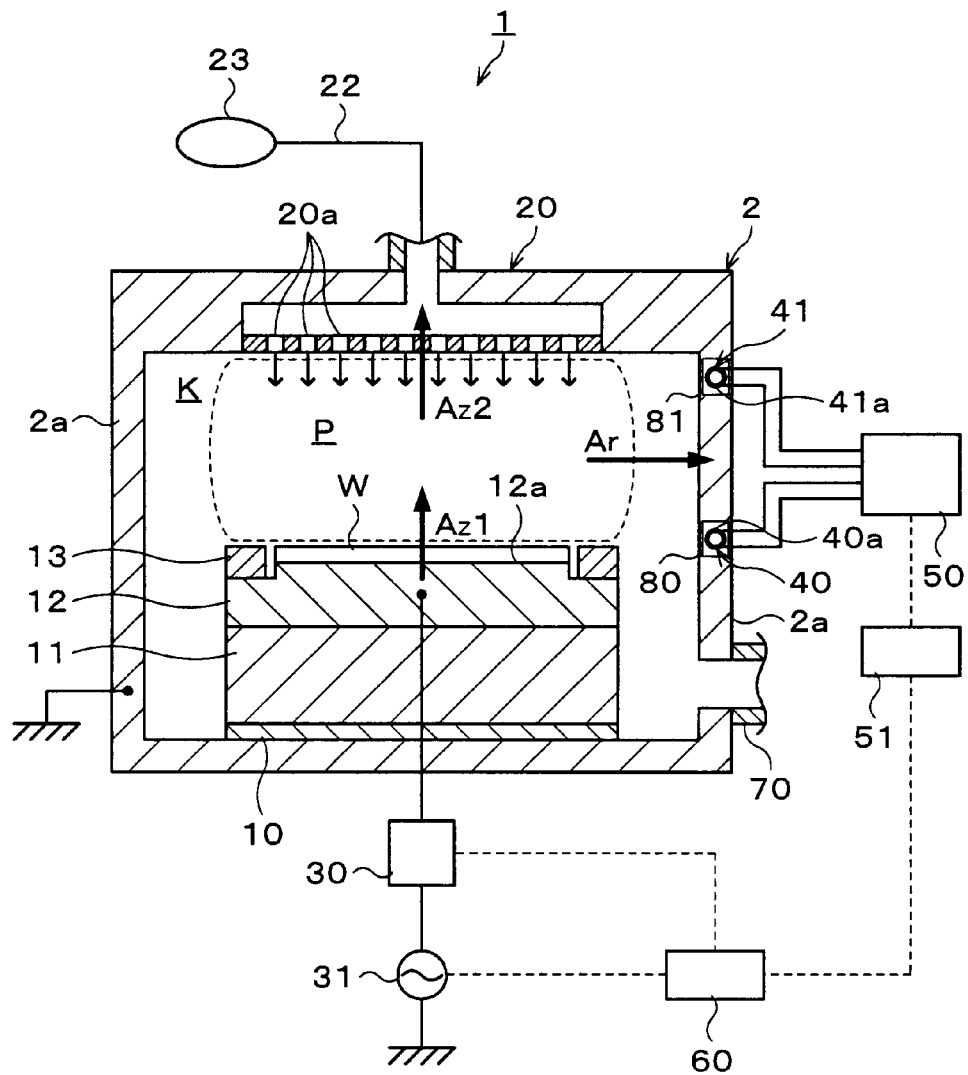
FIG. 7 is an explanatory vertical cross-sectional view roughly showing the structure of a plasma etching apparatus in which probes are provided in a sidewall portion.

In the above-described embodiment, the probes 40, 41 are attached to the sidewall portion 2a of the process vessel 2, but the probes 40, 41 may be buried in the sidewall portion 2a as shown in FIG. 7. In this case, for example, two upper and lower spaces 80, 81 are formed in the sidewall portion 2a, and the probes 40, 41 are disposed in the spaces 80, 81 respectively. With this structure, since the probes 40, 41 do not protrude to the processing space K in the process vessel 2, the plasma in the processing space K is not affected by the probes 40, 41. Further, since the probes 40, 41 are protected by the sidewall portion 2a, the corrosion of the probes 40, 41 caused by the plasma can also be prevented. Incidentally, in this case, the current amounts detected by the probes 40, 41 may possibly decrease as shown in FIG. 5 described above, and therefore, in this case, an amount of this decrease may be taken into consideration in advance in evaluating the radio-frequency current amount Az.

Figure 8:
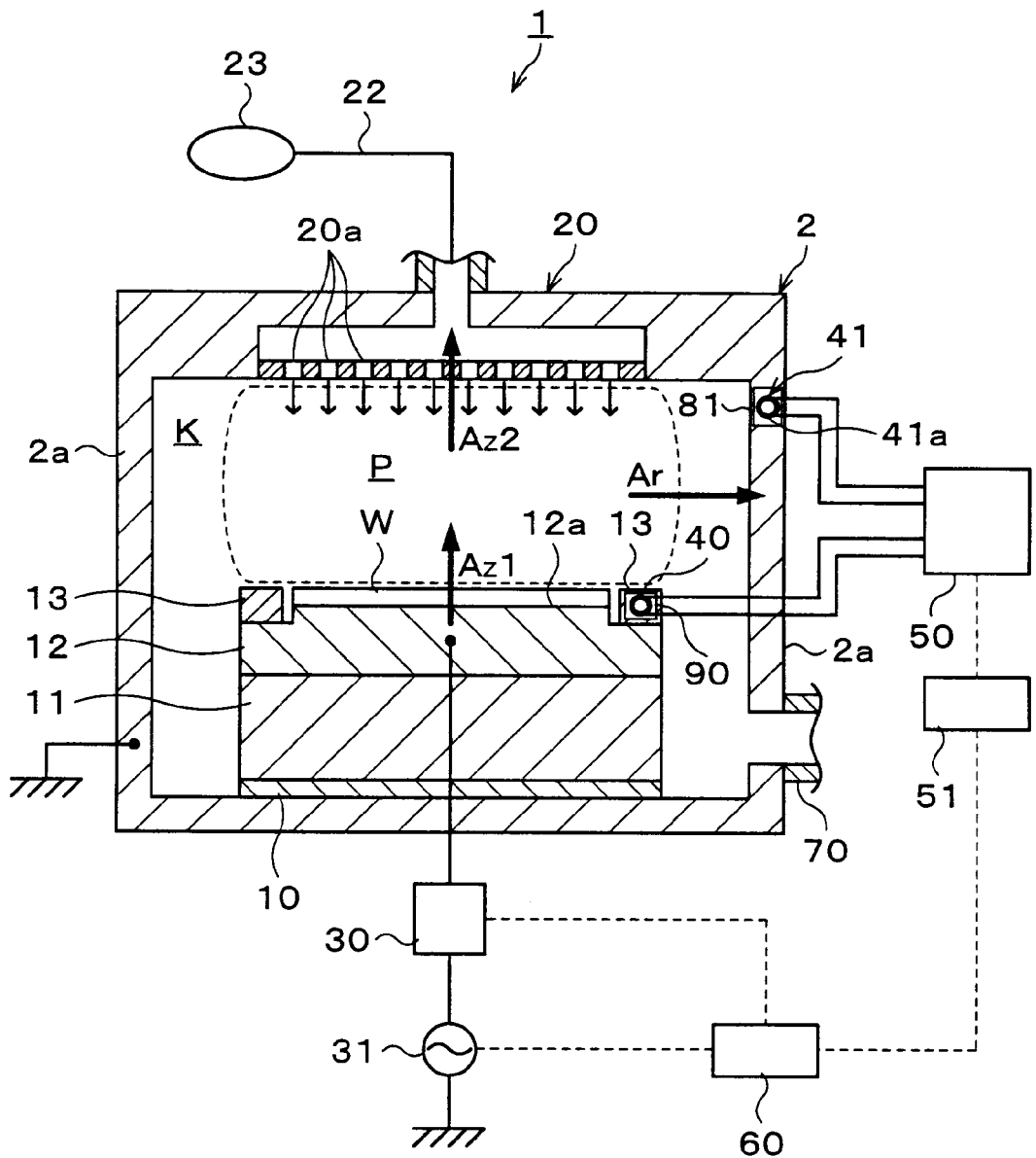
FIG. 8 is an explanatory vertical cross-sectional view roughly showing the structure of a plasma etching apparatus in which a probe is provided in a focus ring.

Further, if a material of the focus ring 13 is a dielectric in the above-described example, the lower probe 40 may be buried in the focus ring 13 provided around the substrate W, as shown in FIG. 8. In such a case, for example, a space 90 is formed in the focus ring 13, and the lower probe 40 is disposed in the space 90. Also in this case, the lower probe 40 does not protrude into the processing space K in the process vessel 2, and thus does not affect the plasma in the processing space K. Further, since the lower probe 40 is protected by the focus ring 13, the corrosion of the lower probe 40 caused by the plasma can also be prevented. Further, since the position of the lower probe 40 is close to the surface of the substrate W, the radio-frequency current amount $Az1$ flowing out to a position immediately above the substrate W, which most influences the etching process, can be correctly detected.

A place in which the probes 40, 41 are buried is not limited to the sidewall portion 2a or the focus ring 13, but the probes 40, 41 may be buried in another dielectric member facing the plasma area P, such as a window portion (not shown) through which the inside of the process vessel 2 is seen or the upper electrode 20.

Figure 9:
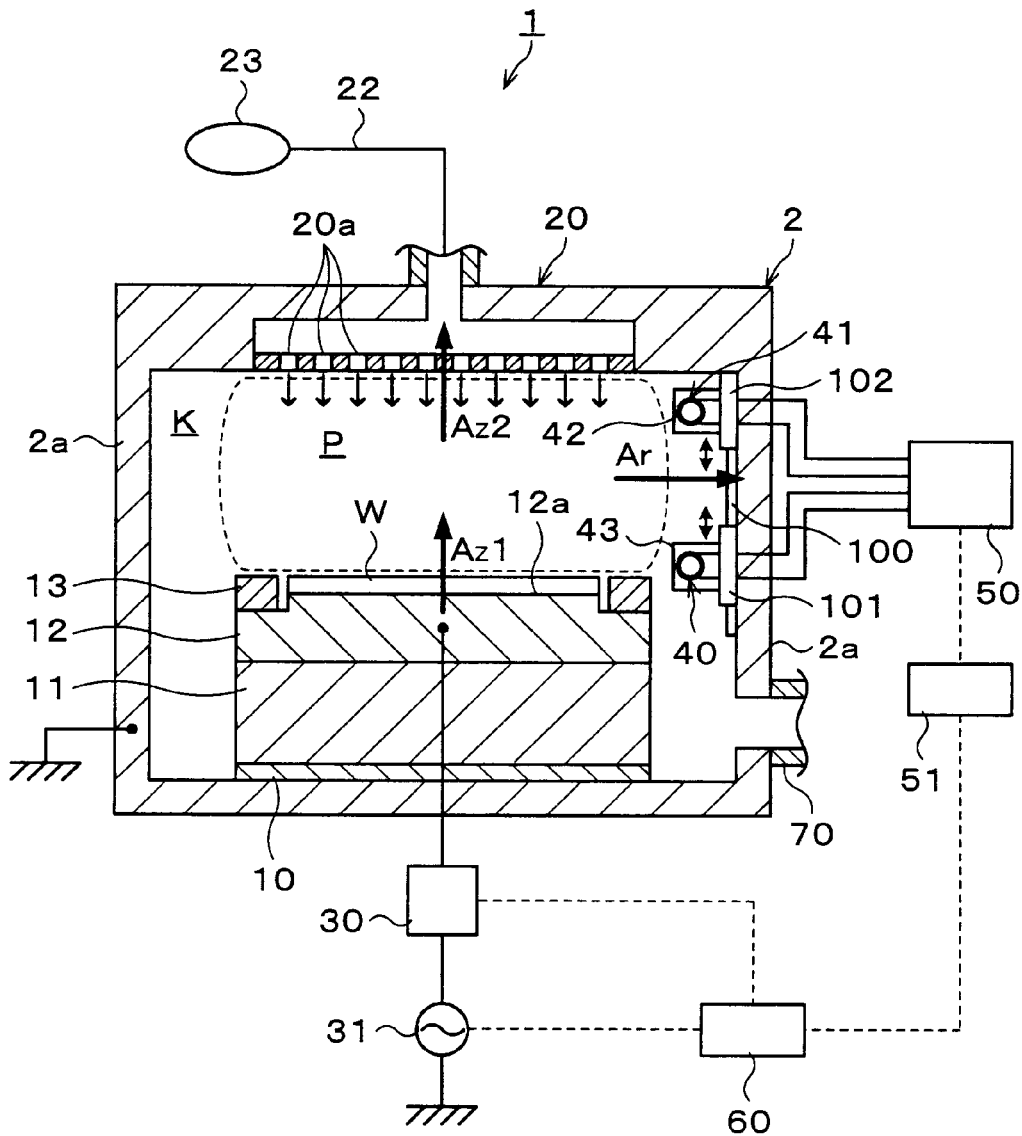
FIG. 9 is an explanatory vertical cross-sectional view roughly showing the structure of a plasma etching apparatus in which probes are movable up and down.

In the above-described embodiment, the probes 40, 41 are fixed on the sidewall portion 2a, but the probes 40, 41 may be movable in the up/down direction. In this case, for example, as shown in FIG. 9, two sliders 101, 102 moving up and down may be provided on a rail 100 which is provided on the sidewall portion 2a of the process vessel 2 to extend in the up/down direction. The lower probe 40 and its cover 42 may be attached on the lower slider 101, and the upper probe 41 and its cover 43 may be attached on the upper slider 102. To detect the radio-frequency current amounts $Az1$, $Az2$ and the loss radio-frequency current amount Ar, one of or both of the lower probe 40 and the upper probe 41 is(are) moved up and down to detect the time varying magnetic flux density at arbitrary positions in the up/down direction, and the radio-frequency current amounts $Az1$, $Az2$ and the loss radio-frequency current amount Ar at each of the positions are calculated. Consequently, for example, it is possible to specify a position where the loss radio-frequency current amount Ar is large or a position where the loss radio-frequency current amount Ar is small, in a surface of the sidewall portion 2a. As a result, it is possible to specify, for example, positions of a crack of the sidewall portion 2a, the peeling of the protective film, or the like which will be a cause of fluctuation in the condition in the process vessel 2. Further, it is possible to know the flow of the radio-frequency current Iz in the plasma area P in more detail, so that it is possible to correctly know the processing state of the substrate W and the condition in the process vessel 2.

In the foregoing, the preferred embodiment of the present invention has been described with reference to the accompanying drawings, but the present invention is not limited to such examples. It is obvious that those skilled in the art could reach various kinds of modified examples and corrected examples within a scope of the spirit described in the claims, and it should be understood that these examples naturally belong to the technical scope of the present invention.

For example, the number of windings of the coils 40a, 41a of the probes 40, 41 is not limited to two, but may be one or may be three or more. Further, the coils 40a, 41a are not limited to be in the circular shape but may be in a square shape. Further, in the above-described embodiment, the radio-frequency power is supplied to the lower electrode 12, but the radio-frequency power may be supplied to the upper electrode 20. Alternatively, the radio-frequency power may be supplied both to the lower electrode 12 and the upper electrode 20. Further, the number of the probes is not limited two but they may be provided at three positions or more. In the above-described embodiment, the present invention is applied to the plasma etching apparatus 1, but the present invention is also applicable to a plasma processing apparatus for substrate processing other than the etching process, for example, a deposition process. Further, the substrate processed in the plasma processing apparatus of the present invention may be any of a semiconductor wafer, an organic EL substrate, a substrate for FPD (flat panel display), and the like.

What is claimed is:

1. A plasma processing apparatus which has upper and lower radio-frequency electrodes facing each other in a process vessel and processes a substrate by supplying radio-frequency power to at least one of the radio-frequency electrodes and generating plasma in the process vessel, the apparatus comprising:

a probe which is disposed in the process vessel to detect a time varying magnetic flux density directed in a azimuthal direction around an up/down-direction center axis of the process vessel; and a calculation part which calculates an amount of radio-frequency current passing in an axial direction in the plasma when the radio-frequency power is supplied, based on the time varying magnetic flux density detected by said probe, wherein plural ones of said probe are provided at a plurality of positions in the up/down direction in the process vessel, and wherein said calculation part subtracts an amount of the radio-frequency current detected by a probe close to one of the radio-frequency electrodes from an amount of the radio-frequency current detected by the probe close to the other radio-frequency electrode and calculates an amount of the radio-frequency current passing in a radial direction, based on an amount by which the radio-frequency current in the axial direction increases/decreases between said probes.

2. The plasma processing apparatus according to claim 1, wherein each of said probes is formed in a coil shape, and an axis of the coil is directed in the azimuthal direction around the up/down-direction center axis of the process vessel.

3. The plasma processing apparatus according to claim 2, wherein each of said probes detects an induced electromotive force generated in the coil, as the time varying magnetic flux density, and wherein said calculation part calculates the amount of the radio-frequency current from the induced electromotive force.

4. The plasma processing apparatus according to claim 1, wherein said probes are provided at heights between the upper and lower radio-frequency electrodes.

5. The plasma processing apparatus according to claim 1, wherein said probes are provided on an outer side of the substrate held on one of the upper and lower radio-frequency electrodes in the process vessel.

6. The plasma processing apparatus according to claim 1, wherein at least one of said probes is provided at a height immediately under the upper radio-frequency electrode, and at least another of said probes is provided at a height immediately above the lower radio-frequency electrode.

7. The plasma processing apparatus according to claim 1, further comprising:

a control part which executes the calculation of the amount of the radio-frequency current between said probes during the processing of the substrate, and stops the processing of the substrate based on the calculated amount of the radio-frequency current and a preset threshold value of the amount of the radio-frequency current.

8. The plasma processing apparatus according to claim 1, further comprising
an analysis part which decomposes the time varying magnetic flux density detected by each of said probes into frequency components included in the detected time varying magnetic flux density, and
wherein said calculation part calculates the amount of the radio-frequency current between said probes for each of the frequencies.

9. The plasma processing apparatus according to claim 8, further comprising an adjustment part which adjusts an amount of the radio-frequency current with a specific frequency based on the amount of the radio-frequency current calculated for each of the frequencies.

10. The plasma processing apparatus according to claim 1, wherein each of said probes is covered by an insulative cover.

11. The plasma processing apparatus according to claim 1, wherein said probes are buried in a member facing the generated plasma.

12. The plasma processing apparatus according to claim 11, wherein said probes are buried in a wall portion of the process vessel.

13. The plasma processing apparatus according to claim 11, wherein the lowest probe is buried in an annular member surrounding an outer periphery of the substrate held on the lower radio-frequency electrode in the process vessel.

14. The plasma processing apparatus according to claim 1, wherein said probes are movable up and down in the process vessel.

\* \* \* \* \*